United States Patent [19]

Thuault

[11] Patent Number: 5,822,197
[45] Date of Patent: Oct. 13, 1998

[54] ELECTRICAL CONNECTION SYSTEM

[75] Inventor: Michel Thuault, Conflans Ste-Honorine, France

[73] Assignee: Connecteurs Cinch, Montigney Le Bretonneux, France

[21] Appl. No.: 839,180

[22] Filed: Apr. 23, 1997

[30] Foreign Application Priority Data

May 29, 1996 [FR] France .................................. 96 06593

[51] Int. Cl.⁶ .................................................. H01R 23/68
[52] U.S. Cl. .......................... 361/803; 361/740; 361/742; 361/788; 361/789; 361/801; 361/804; 439/62; 439/66; 439/67; 439/327; 439/329
[58] Field of Search ..................... 361/740–742, 361/756, 758, 759, 785, 786, 788, 801–804, 732, 789; 439/59, 62, 69, 66, 67, 78, 325, 327–329, 377; 174/138 G

[56] References Cited

U.S. PATENT DOCUMENTS

| | | | |
|---|---|---|---|
| 3,829,741 | 8/1974 | Athey ........................................ | 361/756 |
| 4,626,056 | 12/1986 | Andrews, Jr. et al. ................. | 439/260 |
| 4,895,523 | 1/1990 | Morrison et al. ........................ | 439/67 |
| 4,907,975 | 3/1990 | Dranchak et al. ....................... | 439/67 |
| 5,259,795 | 11/1993 | Yamada et al. .......................... | 439/751 |
| 5,298,686 | 3/1994 | Bourdelaise et al. ................... | 361/785 |
| 5,427,533 | 6/1995 | Chambers .................................. | 439/62 |
| 5,622,505 | 4/1997 | Hashiguchi et al. ..................... | 439/67 |

FOREIGN PATENT DOCUMENTS

| | | | |
|---|---|---|---|
| 0154420 | 9/1985 | European Pat. Off. ........ | H01R 23/68 |
| 0348562 | 1/1990 | European Pat. Off. .......... | H01R 9/09 |
| 0374460 | 6/1990 | European Pat. Off. .......... | H01R 9/07 |
| 0567006 | 10/1993 | European Pat. Off. ........ | H01R 23/70 |

OTHER PUBLICATIONS

Proceeding Of The Electronic Components And Technology Conference, Orlando, Jun. 1–4, 1993, No. Conf. 43, Jun. 1, 1993, Institute of Electrical and Electronics Engineers, pp. 461–464, XP000380041, Pokrzwa et al.,; "A High Density Pad–on–Pad Connector Utilizing a Flexible Circuit."
French Search Report and Annex.

*Primary Examiner*—Leo P. Picard
*Assistant Examiner*—John B. Vigushin
*Attorney, Agent, or Firm*—Greenblum & Bernstein, P.L.C.

[57] ABSTRACT

An electrical connection system includes a frame, a main printed circuit "mother board", a series of secondary printed circuit "daughter boards", and interconnecting spacers formed of an insulative material plate with holes in it into each of which is inserted a buffer that is a good conductor of electricity. The frame includes a support plate with series of slides, the mother board resting on the support plate and receiving the interconnecting spacer. The daughter boards are slid into the slides and include, along an edge which cooperates with the interconnecting spacer, a heel-piece on which is mounted and to which is fixed a flexible printed circuit the tracks of which are connected to those of the daughter board and cooperate with the buffers. Arrangements are provided to fix the daughter boards to the frame.

8 Claims, 5 Drawing Sheets

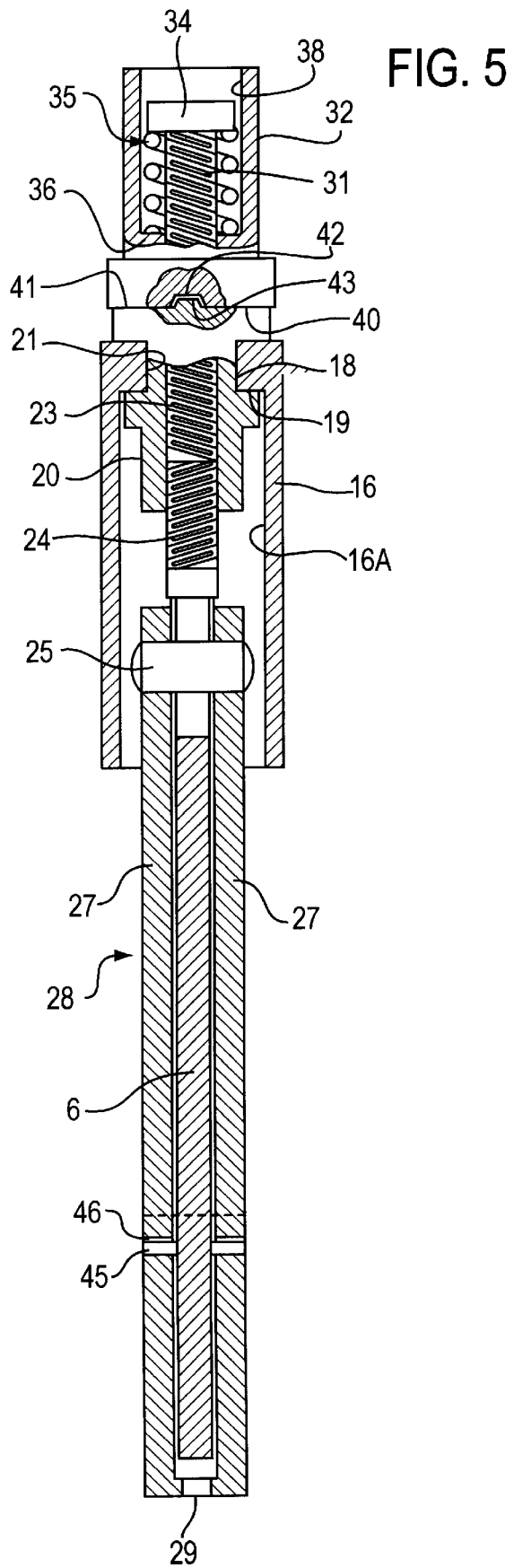

ELECTRICAL CONNECTION SYSTEM

BACKGROUND OF THE INVENTION

1. Field of the invention

The present invention concerns an electrical connection system.

2. Description of the prior art

The present invention concerns a system comprising a frame, a main printed circuit or "mother board", a series of secondary printed circuits or "daughter boards" and members for electrically connecting the circuits on the boards in the form of interconnecting spacers comprising insulative plates with holes in them into which are inserted buffers formed by a highly conductive metal wire having some elasticity bent repeatedly to form a wad and known under the trade name CIN::APSE.

A system of this kind is of great benefit as it enables different circuits to be connected without it being necessary to bring the connections out to the ends of the boards; however, the various boards and the interconnecting spacers are necessarily assembled by stacking them up.

A system of this kind has the disadvantage that changing a daughter board necessitates demounting of the whole system.

Systems comprising a mother board and a series of perpendicular daughter boards are known in themselves. These arrangements are complex and necessitate right-angle electrical connections between the mother boards and the daughter boards which do not provide impedance matching at high frequencies. Moreover, the contact pressures are often insufficient and the electrical connections become defective after a certain number of mounting and demounting operations. Finally, the systems often have poor mechanical and electrical behavior in respect of vibration and impact.

One aim of the present invention is to remedy the above drawbacks and to provide a connection system that is more practical to assemble, accommodates a large number of daughter boards, and allows them to be demounted independently of each other.

SUMMARY OF THE INVENTION

The invention is directed to an electrical connection system including a frame, a main printed circuit "mother board", a series of secondary printed circuit "daughter boards", the printed circuits including tracks and electrical connecting means inserted between the mother board and the daughter boards comprising interconnecting spacers formed of an insulative material plate with holes in it into each of which is inserted a buffer formed of a metal wire that is a good conductor of electricity and has some degree of elasticity, the wire being bent repeatedly to form a wad, the buffers projecting from each face of the plate being made of insulative material and cooperating with corresponding tracks of the mother board and the daughter boards, the frame including a support plate with series of upstanding slides thereon, the mother board resting on the support plate and receiving the interconnecting spacer, the daughter boards being slid into the slides and including, along an edge adapted to cooperate with the interconnecting spacer, a heel-piece on which is mounted and to which is fixed a flexible printed circuit the tracks of which are electrically connected to the tracks of the daughter board and have parts adapted to cooperate with said buffers, a mechanism being provided to fix said daughter boards to the frame.

With this arrangement, a system is obtained having buffers in a demountable area which eliminate the natural resonant frequencies of the contacts because the buffers have a quasi-random geometry.

A system of this kind has good mechanical and electrical behavior in respect of vibration and impact since the contact pressures are in the direction of the translation axis of the daughter boards.

Finally, the printed flexible circuit facilitates impedance matching.

In accordance with one constructional detail, the flexible printed circuit is folded in two in order to wrap around the heel-piece, its free ends being fixed by strips mounted on each side of the daughter board and retained by rivets.

A profiled bearing member is preferably inserted between the flexible printed circuit and the heel-piece, a spring being inserted between the bearing member and the heel-piece. This produces a system of compensating play which distributes pressure forces to obtain rigorous contact between the buffers and the tracks.

To ensure that the various circuits are perfectly connected to the predefined locations, the profiled bearing members include centering lugs adapted to pass through holes in the interconnecting spacer and the mother board.

In accordance with one constructional feature, each daughter board is attached near its edge opposite that including the heel-piece on each side adapted to be inserted into a slide with a strip including elements of operating a pull-rod having a free end provided with a notch adapted to cooperate with the head of a pin attached to the frame.

To regularize the pressure of the tracks on the buffers, the pull-rod operating elements include a torque limiter.

In accordance with one constructional feature, the strip includes a circular hole in which can turn a nut having an axial screwthreaded hole cooperating with a screwthreaded rod connected to the pull-rod, a screwing head being applied against the nut and held elastically by a screw with a compression spring between them, the surfaces in contact of the nut and of the screwing head each including a corresponding notch. This is a simple and inexpensive way to provide a torque limiter.

Finally, in accordance with a final constructional feature, the pull-rod is U-shaped with two branches and a core the free ends of which are joined to a pivot attached to the free end of the screwthreaded rod, the core including the notch, the branches extending either side of the corresponding edge of the daughter board, the latter being attached to a pin inserted in inclined slots in the branches so that, to mount the daughter board on the frame, the tightening of the screwing member firstly secures engagement of the notch on the pin and then the application of the tracks on the flexible printed circuit to the buffers of the interconnecting spacer.

Accordingly, mounting and demounting the daughter boards are greater simplified since simply maneuvering the screwing members assures locking and unlocking at the same time as electrically connecting the mother board and the daughter boards.

The invention will now be described in more detail and by way of example only with reference to one particular embodiment shown in the accompanying drawings.

BRIEF DESCRIPTION OF THE DRAWINGS

FIG. 5 is a sectional view to a larger scale taken along the line 5—5 in FIG. 2.

DETAILED DESCRIPTION OF THE PREFERRED EMBODIMENT

Figure 1:
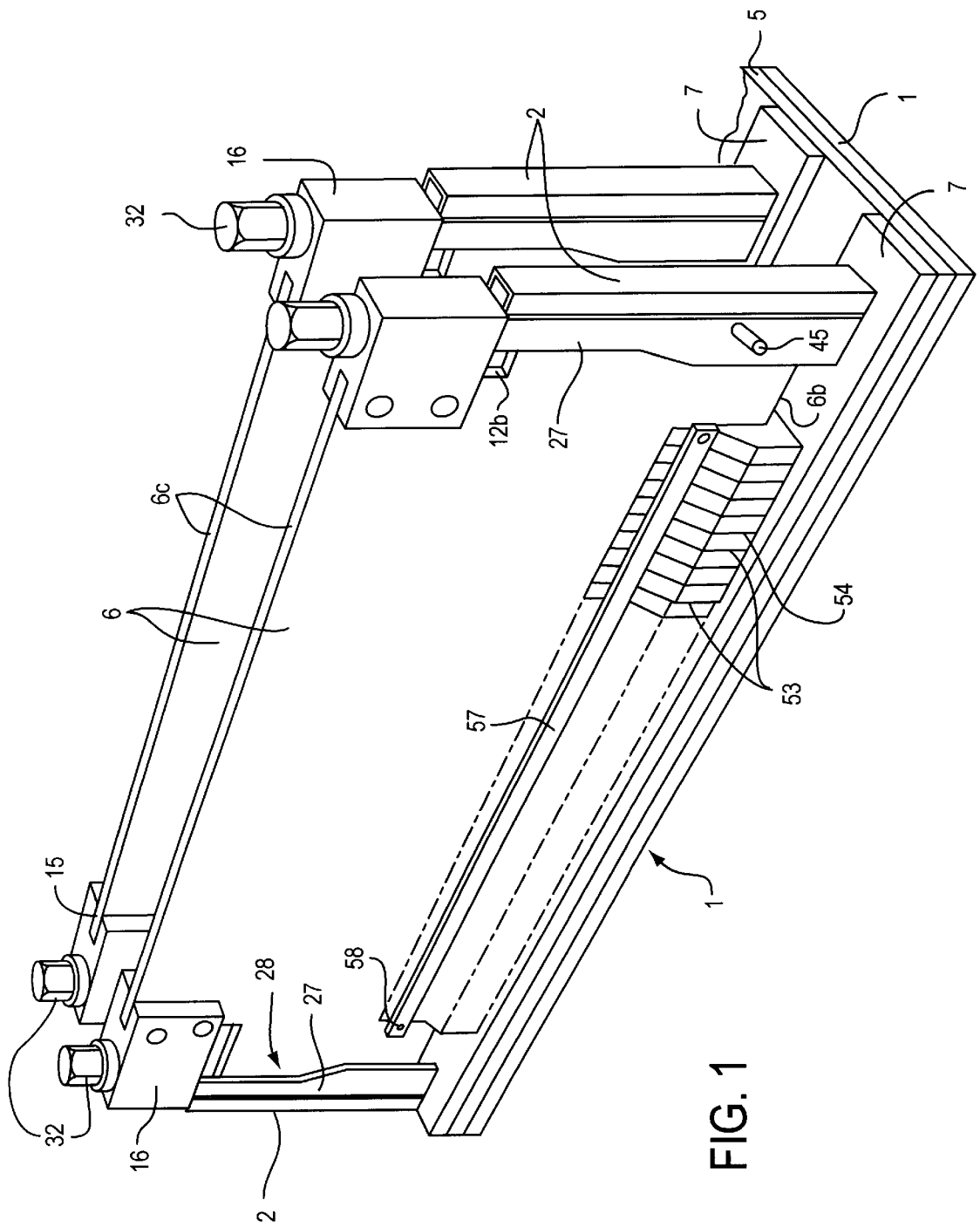
FIG. 1 is a perspective view of a connection system of the invention.
Figure 2:
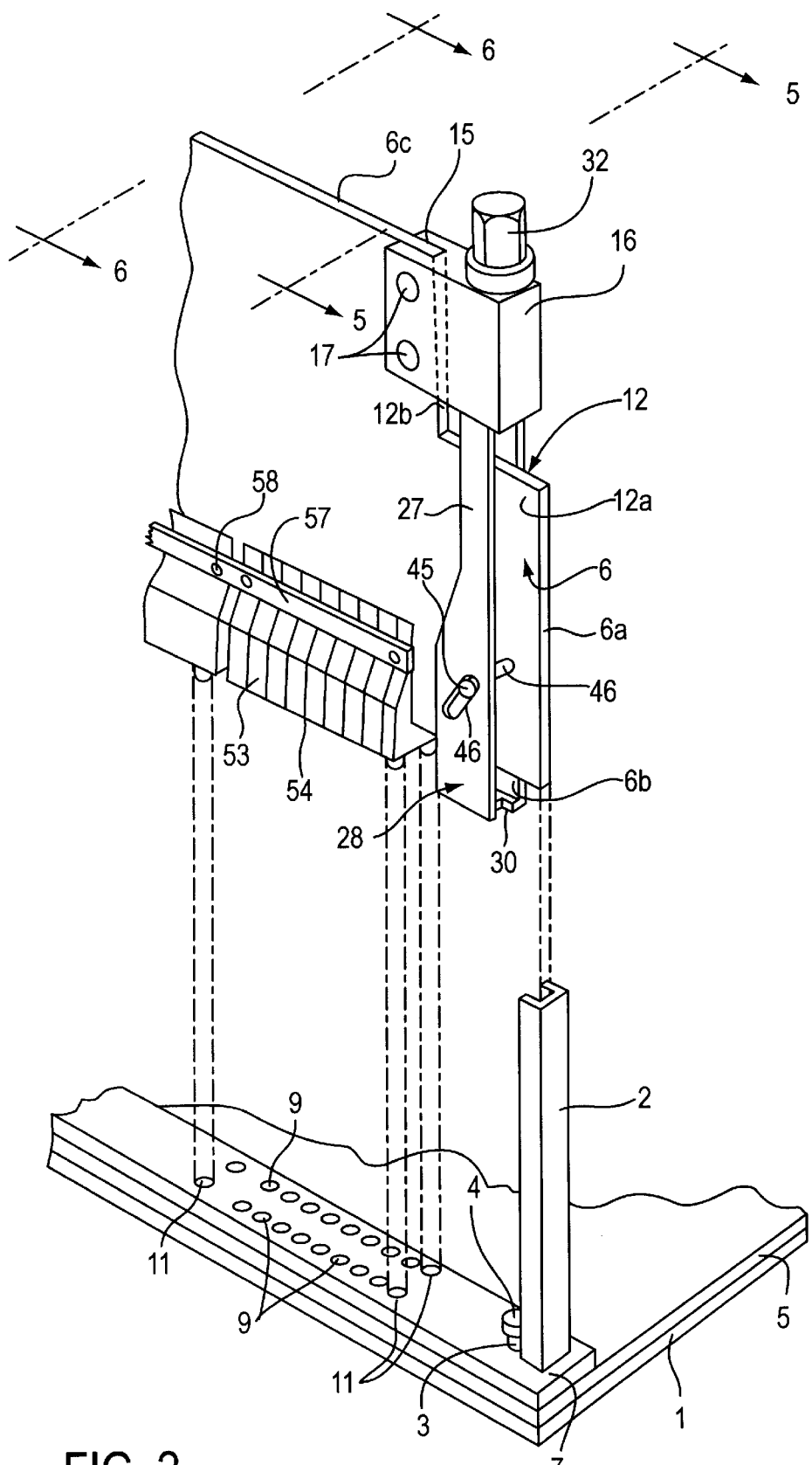
FIG. 2 is a exploded perspective view of part of the connection system of the invention.
Figure 4:
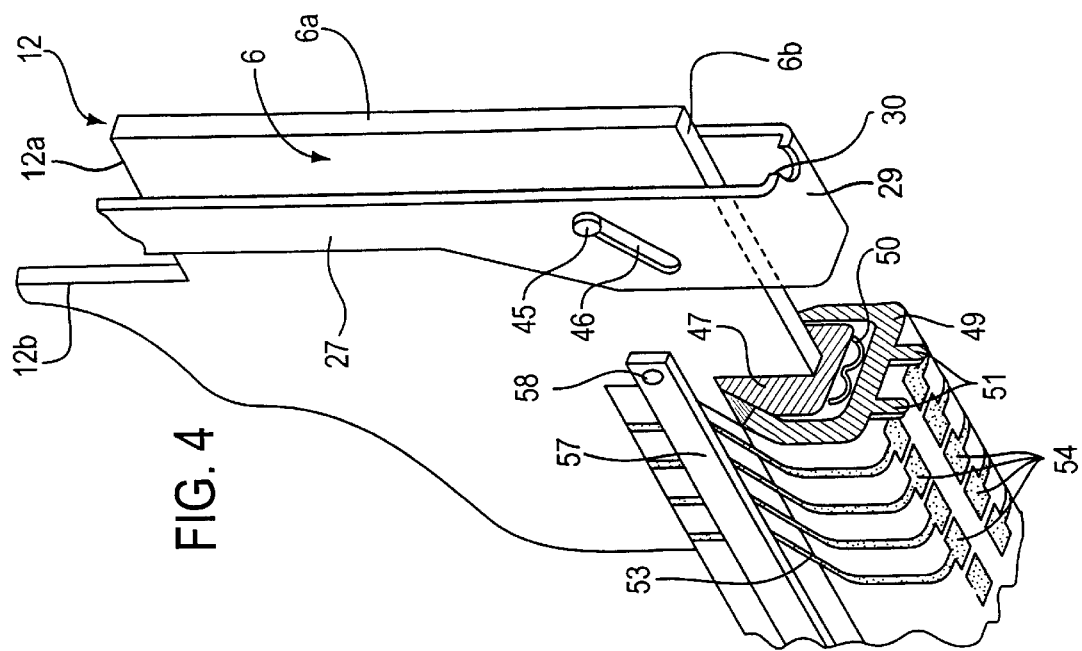
FIG. 4 is a detail perspective view.

The system of the invention comprises a frame formed of a generally rectangular support plate 1 along two opposite edges of which are series of upstanding U-shaped profile members constituting slides 2.

Near each profiled member is a pin 3 terminating in a head 4, the pins being attached to the support plate 1.

The support plate 1 carries a main printed circuit, a mother board 5 that has a certain number of tracks 10 having to be connected to daughter boards 6 engaged in the slides 2.

On the mother board 5 there are disposed, between pairs of slides 2, interconnecting spacers 7 each comprising an insulative material plate 7a with holes 8 in it into each of which is inserted a buffer 9 in the form of an electrically conductive metal wire which has a certain degree of elasticity and is bent repeatedly to form a wad, the buffers projecting from both sides of the plate 7a.

The mother board 5 and the interconnecting spacers 7 include openings where they fit over the slides 2 and the pins 3 and centering holes 11.

The daughter boards 6 have a certain number of tracks and are generally rectangular with two shorter sides 6a and two longer sides 6b, 6c.

Near the longer side 6c, the shorter side 6a include an angular L-shape cut-out 12 with branches 12a and 12b, the branch 12b being inserted into a groove 15 in a strip 16 and fixed to the latter by rivets 17 passing through the strip 16 perpendicularly to the groove 15.

The strip 16 has a hollow body 16a with a circular opening 18 provided with a shoulder 19.

In the hollow body 16a is housed a nut 20 with a groove 21 cooperating with the shoulder 19 and an axial screwthreaded passage 23 through it into one end of which is screwed a screwthreaded rod 24 attached at its free end to a pivot 25 about which pivot the two branches 27 of a U-shape pull-rod 28, the core 29 of which includes a notch 30.

Into the end of the screwthread 23 opposite that receiving the rod 24 is screwed a screw 31 which passes through a passage 38 of a screwing head 32 having on the inside a shoulder 36 against which bears one end of a compression spring 35, the other end of which bears against a head 34 of the screw 31.

The outside of the screwing head 32 is hexagonal and the head has a bearing surface 40 which bears against the corresponding end 41 of the nut 20.

The screwing head 32 has a notch 42 on the bearing surface 40 and the end 41 of the nut 20 is formed with a tooth 43 to be inserted into the notch 42.

This provides a simple torque limiter, the screwing head 32 uncoupling from the nut 20 if the screwing force exceeds a particular threshold.

The daughter boards 6 are provided, near the shorter sides 6a, with a pin 45 to be inserted into inclined slots 46 in the branches 27 of the pull-rods 28.

Heel-pieces 47 on which are engaged profiled bearing members 49 are nested over the bottom edge of the daughter boards 6, by means of slots 48, springs 50 being disposed between these two parts.

A flexible printed circuit 53 with tracks 54 covers the outside surface of the profile bearing member 49, the flexible printed circuit being fixed to the corresponding daughter board by strips 57 disposed on either side of the daughter boards 6 and fixed by rivets 58 passing through the thickness of the boards 6.

The tracks 54 of the flexible printed circuit are connected to the corresponding tracks of the daughter board 6 by soldered joints 59.

The profiled bearing member 49 includes pins 51 that engage in the centering holes 11.

The tracks 54 are laid out to cooperate with the buffers 9 of the corresponding interconnecting spacer 7.

Figure 3:
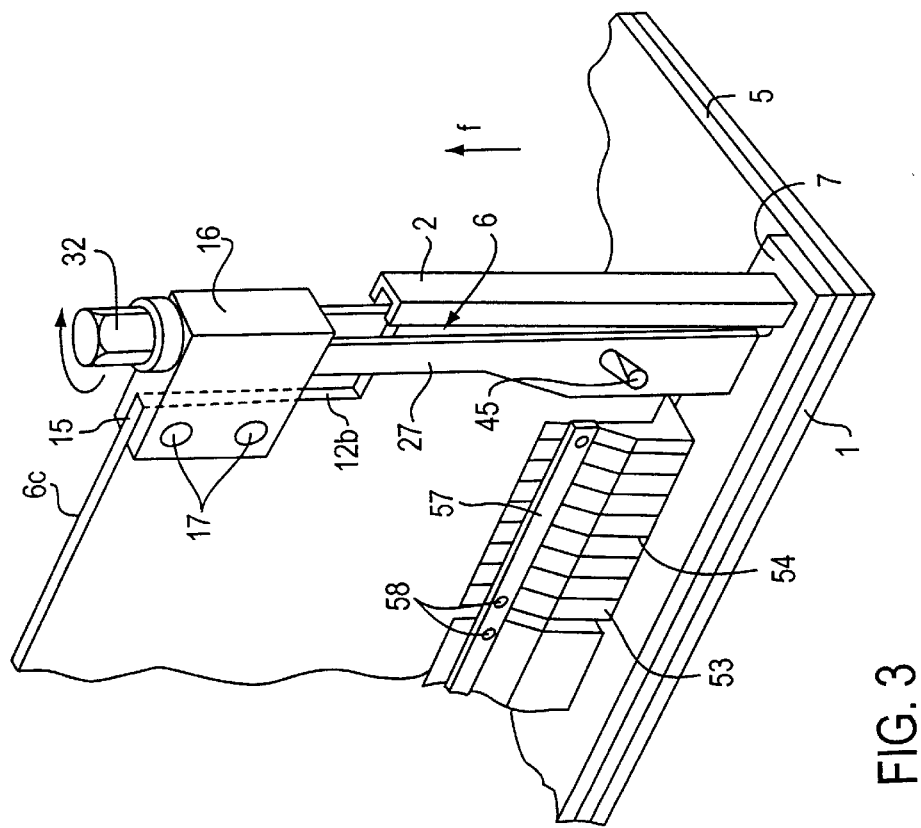
FIG. 3 is also a perspective view of part of the connection system of the invention.
Figure 6:
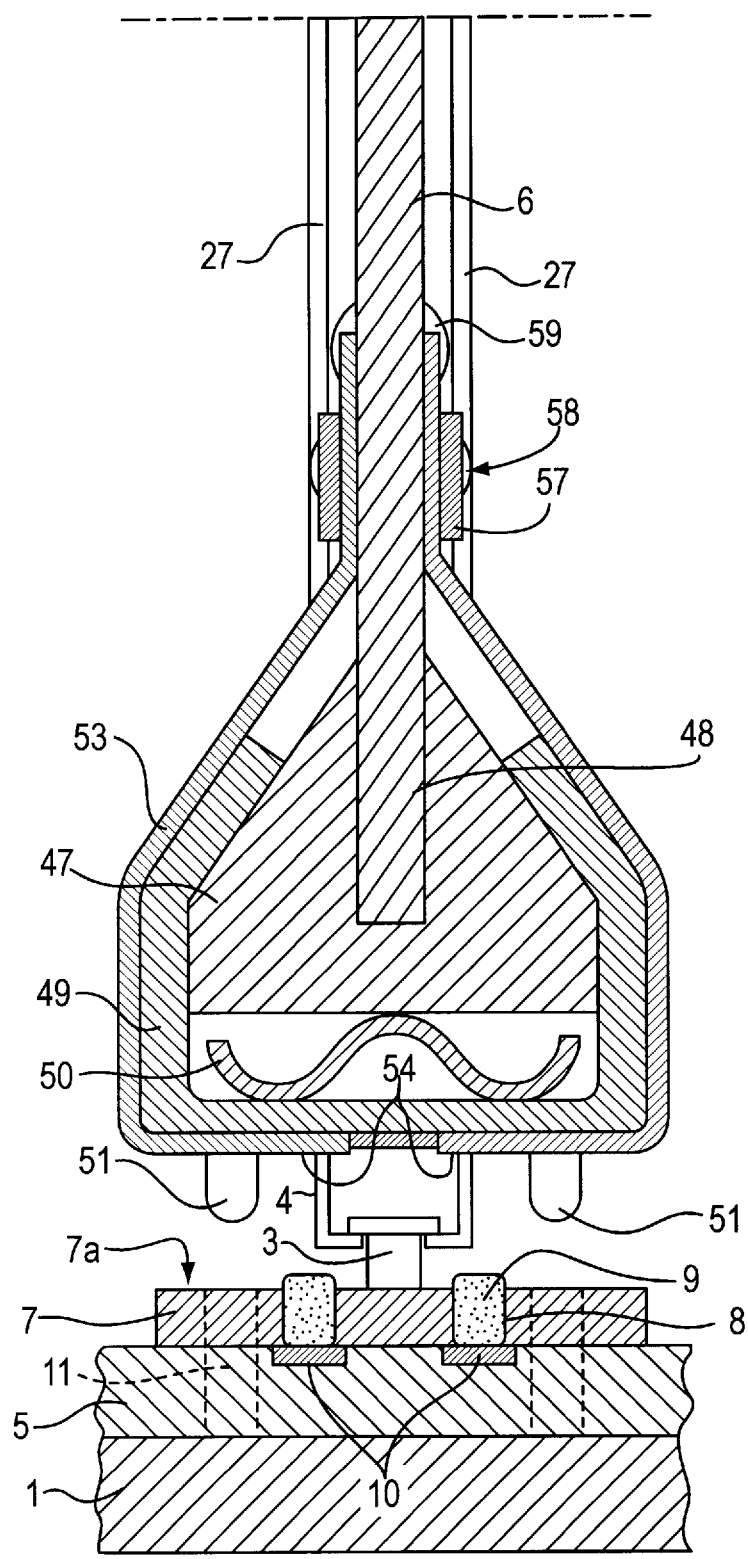
FIG. 6 is a view to a larger scale taken along the line 6—6 in FIG. 2.

The procedure for mounting the daughter boards is as follows:

The daughter boards 6 are slid into the slides 2, the screwing head 32 having been turned beforehand in the counterclockwise direction until the pins 45 cooperate with the ends of the inclined slots facing towards the strips 16. The screwing head 32 is then turned in the opposite direction and therefore entrains the nut 20, the screwthread 23 of which, cooperating with the screwthreaded rod 24, tends to move the pull-rod 28 in the direction of the arrow f (see FIG. 3) so that the pull-rod 28 tilts slightly on the pivot 25 as the pin 45 is guided to the end of the slots 46 adjacent the core 29 in order for the corresponding notch 30 to engage on the pin 3.

On continuing to turn the head 32, the inside surface of the core 29 is locked against the head 4 and the whole of the secondary circuit 6 is firmly pressed against the buffers 9 of the interconnecting spacer 7 by the flexible circuit 53. To prevent excessive tightness that could damage the printed circuits and the daughter boards, a torque limiter is provided. If the clamping force exceeds a particular threshold the tooth 43 escapes from the notch 42.

Of course, the invention is not limited to the embodiment just described and shown. Numerous modifications of detail can be made thereto without departing from the scope of the invention.

There is claimed:

1. An electrical connection system, comprising:

a frame including a support plate including a series of upstanding slides thereon;

a main printed circuit mother board including tracks;

a series of secondary printed circuit daughter boards including tracks;

electrical connecting elements inserted between said mother board and said daughter boards comprising interconnecting spacers formed of insulative material plates, each insulative material plate comprising holes therein, a buffer formed of a metal wire that is a good conductor of electricity and has some degree of elasticity in each of said holes in said plate, said wire being bent repeatedly to form a wad, said buffers projecting from each face of said plate and cooperating with corresponding tracks of said mother board and said daughter boards;

said mother board resting on said support plate and receiving said interconnecting spacers;

said daughter boards being slid into said slides and including, along an edge adapted to cooperate with one of said interconnecting spacers, a heel-piece on which is mounted and to which is fixed a flexible printed circuit comprising the tracks which are electrically connected to said tracks of said daughter board and have parts adapted to cooperate with said buffers; and a mechanism fixing said daughter boards to said frame.

2. The electrical connection system claimed in claim 1, wherein said flexible printed circuit is folded in two in order to wrap around said heel-piece, and includes a free end fixed by strips mounted in each side of said daughter board and retained by rivets.

3. The electrical connection system claimed in claim 1, including a profiled bearing member inserted between said flexible printed circuit and said heel-piece, and a spring inserted between said bearing member and said heel-piece.

4. The electrical connection system claimed in claim 3, wherein said profiled bearing member includes centering pins adapted to pass through holes in one of said interconnecting spacers and said mother board.

5. The electrical connection system claimed in claimed 1, wherein each of said daughter boards is fastened, near an edge opposite that including said heel-piece, on each side adapted to be inserted into said slide, to a strip including operating elements including a pull-rod, said pull-rod including a free end having a cooperating notch adapted to cooperate with a head of a pin attached to said frame.

6. The electrical connection system claimed in claim 5, wherein said operating elements include a torque limiter.

7. The electrical connection system claimed in claim 5, wherein said strip includes a circular hole, a nut rotatable in said circular hole, said nut including an axial screwthreaded rod coupled to said pull-rod, a screwing head applied against said nut and retained elastically by a screw with a compression spring therebetween, and contacting surfaces of said nut and said screwing head including a tooth on one of the surfaces and a corresponding notch on another surface.

8. The electrical connection system claimed in claim 7, wherein said pull-rod is U-shaped including two branches and a core including said cooperating notch, free ends of said branches connected to a pivot attached to a free end of said screwthreaded rod, said branches extending on either side of a corresponding edge of said daughter board, each daughter board including pins insertable in inclined slots of said branches so that, to mount one of said daughter boards on said frame, tightening said screwing head firstly engages said cooperating notch on said pin attached to said frame, and then presses the tracks of said flexible printed circuit against said buffers of said interconnecting spacers.

\* \* \* \* \*